United States Patent
Monroe et al.

(10) Patent No.: US 8,661,399 B1
(45) Date of Patent: Feb. 25, 2014

(54) BUILT-IN-SELF-TEST (BIST) ORGANIZATIONAL FILE GENERATION

(75) Inventors: Craig M. Monroe, South Burlington, VT (US); Michael R. Ouellette, Westford, VT (US); Douglas E. Sprague, Jericho, VT (US)

(73) Assignee: International Business Machines Corporation, Armonk, NY (US)

( * ) Notice: Subject to any disclaimer, the term of this patent is extended or adjusted under 35 U.S.C. 154(b) by 4 days.

(21) Appl. No.: 13/567,127

(22) Filed: Aug. 6, 2012

(51) Int. Cl.
*G06F 17/50* (2006.01)

(52) U.S. Cl.
USPC ........... 716/138; 716/103; 716/106; 716/100; 716/102; 717/106; 717/135; 717/104; 717/123; 714/718

(58) Field of Classification Search
None
See application file for complete search history.

(56) References Cited

U.S. PATENT DOCUMENTS

| | | | |
|---|---|---|---|
| 5,646,249 A | 7/1997 | Kaye et al. | |
| 6,332,211 B1 | 12/2001 | Pavela | |
| 6,678,875 B2 * | 1/2004 | Pajak et al. | 716/106 |
| 6,721,923 B2 | 4/2004 | Fisher | |
| 6,978,440 B1 | 12/2005 | Pavela | |
| 7,493,519 B2 | 2/2009 | Andreev et al. | |
| 7,926,012 B1 * | 4/2011 | Parimi et al. | 716/106 |
| 8,239,818 B1 * | 8/2012 | Monroe et al. | 716/138 |
| 2002/0029377 A1 | 3/2002 | Pavela | |
| 2003/0159124 A1 | 8/2003 | Fisher | |
| 2003/0221177 A1 * | 11/2003 | Lakshmanan et al. | 716/10 |

OTHER PUBLICATIONS

Apello et al., Exploiting Programmable BIST for the Diagnosis of Embedded Memory Cores, ITC International Test Conference, IEEE, 2003, pp. 379-385.

* cited by examiner

*Primary Examiner* — John Trimmings
(74) *Attorney, Agent, or Firm* — David A. Cain; Hoffman Warnick LLC

(57) ABSTRACT

Aspects of the invention provide for creating a built-in-self-test (BIST) organizational file for an integrated circuit (IC) chip. In one embodiment, a method includes: receiving a design file including a hierarchy of memory modules, each module including a plurality of memory wrappers; scanning each memory wrapper in each hierarchical level of memory modules for a BIST type; creating, based on the hierarchical level and the BIST type, an ordered list of memory wrappers; adding, based on the BIST type, a BIST engine for each memory wrapper listed in the ordered list; and adding a plurality of references statements to the ordered list to create the BIST organizational file.

20 Claims, 12 Drawing Sheets

```
# Seeded Org File for Module1
# prefix   Element/            Hierarchical
#token     Cellname            Instance Name (relative to module)

hier_ref=Module1
view=BISTCNTL_ref1
ref     Module_a::BISTCNTL_ref1    InstA
ref     Module_a::BISTCNTL_ref1    InstB
bist    BIST1S                     Inst1_BIST1S
mem     WRAP1S                     Inst1
bist    BIST1S                     Inst4_BIST1S
mem     WRAP1S                     Inst4
bist    BIST1S                     Inst5_BIST1S
mem     WRAP1S                     Inst5
bist    BIST1S                     Inst7_BIST1S
mem     WRAP1S                     Inst7
bist    BIST2T                     Inst2_BIST2T
mem     WRAP2T                     Inst2
bist    BIST2T                     Inst3_BIST2T
mem     WRAP2T                     Inst3
bist    BIST2T                     Inst6_BIST2T
mem     WRAP2T                     Inst6
```

FIG. 8A

| | | |
|---|---|---|
| bist | BIST1S | InstC.Inst1_BIST1S |
| mem | WRAP1S | InstC.Inst1 |
| bist | BIST1S | InstC.Inst3_BIST1S |
| mem | WRAP1S | InstC.Inst3 |
| bist | BIST2T | InstC.Inst2_BIST2T |
| mem | WRAP2T | InstC.Inst2 |
| bist | BIST2T | InstC.Inst5_BIST2T |
| mem | WRAP2T | InstC.Inst5 |
| bist | BISTCAM | InstC.Inst4_BISTCAM |
| mem | WRAPCAM | InstC.Inst4 |
| bist | BISTCAM | InstC.Inst6_BISTCAM |
| mem | WRAPCAM | InstC.Inst6 |
| end_view | | |

FIG. 8B

```
# MRF File:  Module1
# Lower      Insertion                                      Views on
Module      Project Dir                                    Lower Module Module_a     root/dir/testcase/mbist_run                    BISTCNTL_ref1
Module_b     root/dir/testcase/mbist_run                    WRAP_FUSECNTL_ref1 BISTCNTL_ref1
```

BUILT-IN-SELF-TEST (BIST) ORGANIZATIONAL FILE GENERATION

BACKGROUND OF THE INVENTION

The subject matter disclosed herein relates generally to integrated circuits. More specifically, the disclosure provided herein relates to methods for creating a built-in-self-test (BIST) organizational file for an integrated circuit (IC) chip.

A BIST organizational file is a data structure that represents a customer's desired memory BIST organization for a particular chip design, or a subset of the chip design. A chip design may contain hundreds or thousands of embedded memories that must be tested. Since each hierarchical memory wrapper instance name must be represented in the BIST organizational file, it would take a significant amount of time to manually develop a BIST organizational file.

BRIEF DESCRIPTION OF THE INVENTION

Aspects of the invention provide for creating a built-in-self-test (BIST) organizational file for an integrated circuit (IC) chip. In one embodiment, a method includes: receiving a design file including a hierarchy of memory modules, each module including a plurality of memory wrappers; scanning each memory wrapper in each hierarchical level of memory modules for a BIST type; creating, based on the hierarchical level and the BIST type, an ordered list of memory wrappers; adding, based on the BIST type, a BIST engine for each memory wrapper listed in the ordered list; and adding a plurality of references statements to the ordered list to create the BIST organizational file.

A first aspect of the invention provides a computer-implemented method of creating a built-in-self-test (BIST) organizational file for an integrated circuit (IC) chip, the method comprising: receiving a design file including a hierarchy of memory modules, each module including a plurality of memory wrappers; scanning each memory wrapper in each hierarchical level of memory modules for a BIST type; creating, based on the hierarchical level and the BIST type, an ordered list of memory wrappers; adding, based on the BIST type, a BIST engine for each memory wrapper listed in the ordered list; and adding a plurality of references statements to the ordered list to create the BIST organizational file.

A second aspect of the invention provides a computer program comprising program code embodied in at least one computer-readable medium, which when executed, enables a computer system to implement a method of creating a built-in-self-test (BIST) organizational file for an integrated circuit (IC) chip, the method comprising: receiving a design file including a hierarchy of memory modules, each module including a plurality of memory wrappers; scanning each memory wrapper in each hierarchical level of memory modules for a BIST type; creating, based on the hierarchical level and the BIST type, an ordered list of memory wrappers; adding, based on the BIST type, a BIST engine for each memory wrapper listed in the ordered list; and adding a plurality of references statements to the ordered list to create the BIST organizational file.

A third aspect of the invention provides a computer system, comprising: at least one computing device configured to create a built-in-self-test (BIST) organizational file for an integrated circuit (IC) chip by: receiving a design file including a hierarchy of memory modules, each module including a plurality of memory wrappers; scanning each memory wrapper in each hierarchical level of memory modules for a BIST type; creating, based on the hierarchical level and the BIST type, an ordered list of memory wrappers; adding, based on the BIST type, a BIST engine for each memory wrapper listed in the ordered list; and adding a plurality of references statements to the ordered list to create the BIST organizational file.

BRIEF DESCRIPTION OF THE DRAWINGS

These and other features of this invention will be more readily understood from the following detailed description of the various aspects of the invention taken in conjunction with the accompanying drawings that depict various embodiments of the invention, in which:

FIG. 8A-8B show a BIST organizational file according to embodiments of the invention.

FIG. 10 shows a module reference file according to embodiments of the invention.

It is noted that the drawings of the invention are not to scale. The drawings are intended to depict only typical aspects of the invention, and therefore should not be considered as limiting the scope of the invention. In the drawings, like numbering represents like elements between the drawings.

DETAILED DESCRIPTION OF THE INVENTION

As mentioned above, the subject matter disclosed herein relates generally to integrated circuits. More specifically, the disclosure provided herein relates to methods for creating a built-in-self-test (BIST) organizational file for an integrated circuit (IC) chip.

A BIST organizational file is a data structure that represents a customer's desired memory BIST organization for a particular chip design, or a subset of the chip design. A chip design may contain hundreds or thousands of embedded memories that must be tested. Since each hierarchical memory wrapper instance name must be represented in the BIST organizational file, it would take a significant amount of time to manually develop a BIST organizational file.

Aspects of the invention provide for creating a built-in-self-test (BIST) organizational file for an integrated circuit (IC) chip. In one embodiment, a method includes: receiving a design file including a hierarchy of memory modules, each module including a plurality of memory wrappers; scanning each memory wrapper in each hierarchical level of memory modules for a BIST type; creating, based on the hierarchical level and the BIST type, an ordered list of memory wrappers; adding, based on the BIST type, a BIST engine for each memory wrapper listed in the ordered list; and adding a plurality of references statements to the ordered list to create the BIST organizational file. The BIST organizational file created is a default file that can be modified by the customer, according to the customer's specific desired arrangement.

Figure 1:
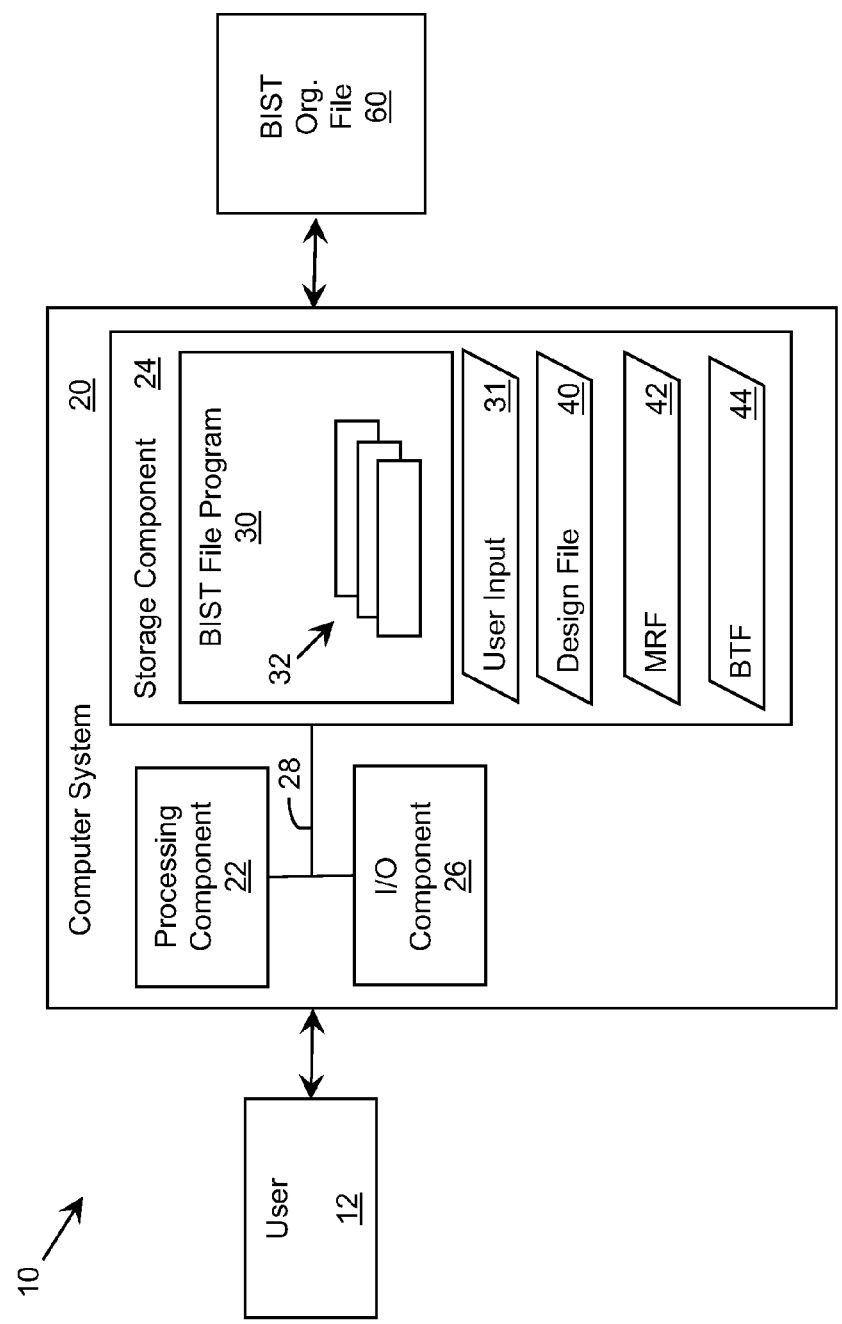
FIG. 1 shows an illustrative environment according to embodiments of the invention.

Turning now to FIG. 1, an illustrative environment 10 for creating a BIST organizational file 60 for an IC according to embodiments of the invention is shown. To this extent, environment 10 includes a computer system 20 that can perform a process described herein in order to create a BIST organizational file 60 for an IC. In particular, computer system 20 is shown including a grouping program BIST file program 30, which makes computer system 20 operable to create BIST organizational file 10 by performing the process described below with respect to FIGS. 2-10.

Computer system 20 is shown including a processing component 22 (e.g., one or more processors), a storage component 24 (e.g., a storage hierarchy), an input/output (I/O) component 26 (e.g., one or more I/O interfaces and/or devices), and a communications pathway 28. In general, processing component 22 executes program code, such as BIST file program 30, which is at least partially fixed in storage component 24. While executing program code, processing component 22 can process data, which can result in reading and/or writing transformed data from/to storage component 24 and/or I/O component 26 for further processing. Pathway 28 provides a communications link between each of the components in computer system 20. I/O component 26 can comprise one or more human I/O devices, which enable a human user 12 to interact with computer system 20 and/or one or more communications devices to enable a system user 12 to communicate with computer system 20 using any type of communications link. To this extent, BIST file program 30 can manage a set of interfaces (e.g., graphical user interface(s), application program interface, and/or the like) that enable human and/or system users 12 to interact with BIST file program 30. Further, BIST file program 30 can manage (e.g., store, retrieve, create, manipulate, organize, present, etc.) the data, such as a design file 40, a module reference file (MRF) 42, or a BIST tech file (BTF) 46, using any solution.

In any event, computer system 20 can comprise one or more general purpose computing articles of manufacture (e.g., computing devices) capable of executing program code, such as BIST file program 30, installed thereon. As used herein, it is understood that "program code" means any collection of instructions, in any language, code or notation, that cause a computing device having an information processing capability to perform a particular action either directly or after any combination of the following: (a) conversion to another language, code or notation; (b) reproduction in a different material form; and/or (c) decompression. To this extent, BIST file program 30 can be embodied as any combination of system software and/or application software.

Further, BIST file program 30 can be implemented using a set of modules 32. In this case, a module 32 can enable computer system 20 to perform a set of tasks used by BIST file program 30, and can be separately developed and/or implemented apart from other portions of BIST file program 30. As used herein, the term "component" means any configuration of hardware, with or without software, which implements the functionality described in conjunction therewith using any solution, while the term "module" means program code that enables a computer system 20 to implement the actions described in conjunction therewith using any solution. When fixed in a storage component 24 of a computer system 20 that includes a processing component 22, a module is a substantial portion of a component that implements the actions. Regardless, it is understood that two or more components, modules, and/or systems may share some/all of their respective hardware and/or software. Further, it is understood that some of the functionality discussed herein may not be implemented or additional functionality may be included as part of computer system 20.

When computer system 20 comprises multiple computing devices, each computing device can have only a portion of BIST file program 30 fixed thereon (e.g., one or more modules 32). However, it is understood that computer system 20 and BIST file program 30 are only representative of various possible equivalent computer systems that may perform a process described herein. To this extent, in other embodiments, the functionality provided by computer system 20 and BIST file program 30 can be at least partially implemented by one or more computing devices that include any combination of general and/or specific purpose hardware with or without program code. In each embodiment, the hardware and program code, if included, can be created using standard engineering and programming techniques, respectively.

Regardless, when computer system 20 includes multiple computing devices, the computing devices can communicate over any type of communications link. Further, while performing a process described herein, computer system 20 can communicate with one or more other computer systems using any type of communications link. In either case, the communications link can comprise any combination of various types of optical fiber, wired, and/or wireless links; comprise any combination of one or more types of networks; and/or utilize any combination of various types of transmission techniques and protocols.

As discussed herein, BIST file program 30 enables computer system 20 to create a BIST organizational file 60 of an IC (e.g., represented by design file 40). To this extent, computer system 20 may perform the method according to aspects of the invention, as discussed herein with respect to FIGS. 2-11.

Figure 2:
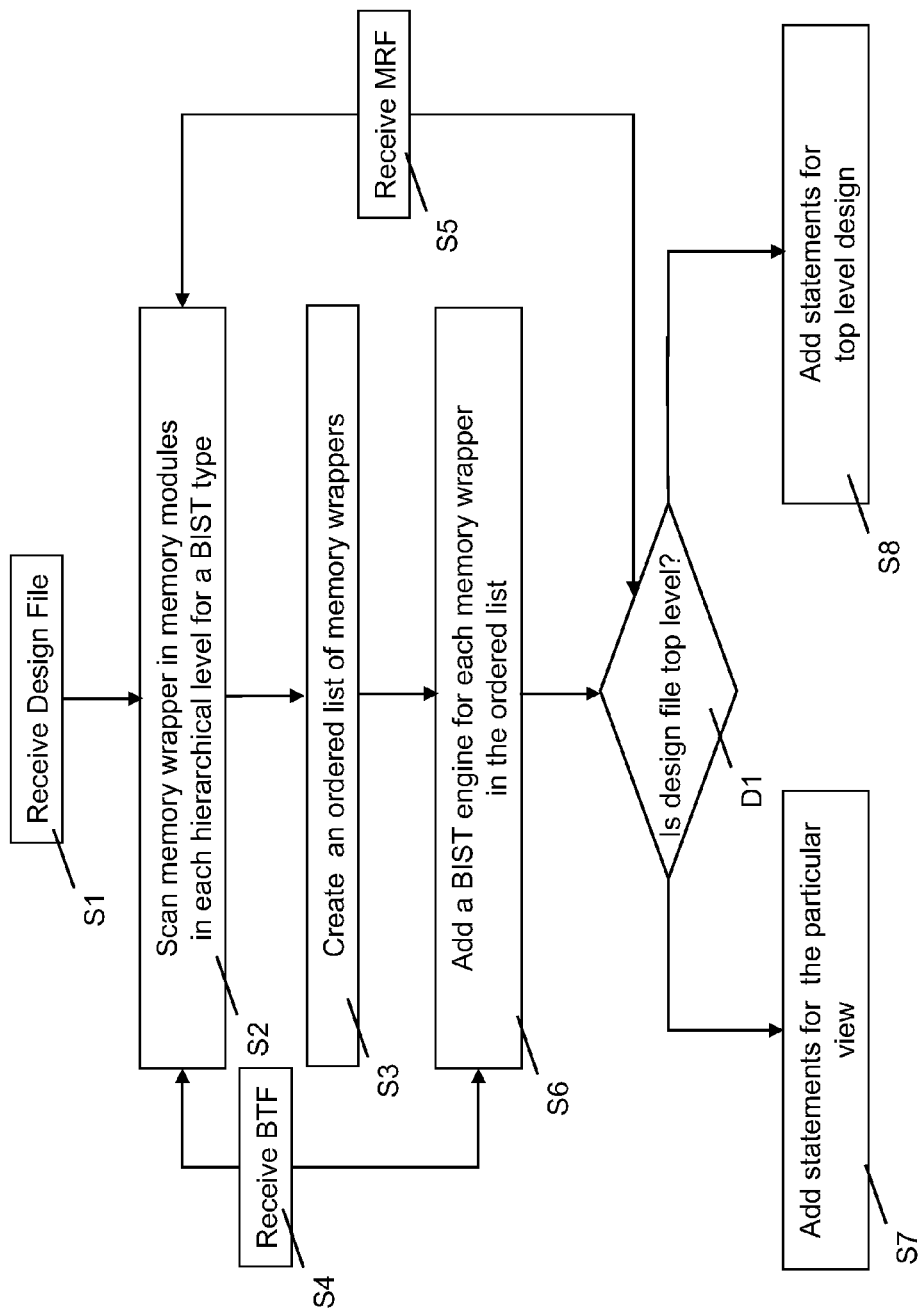
FIG. 2 shows a flow diagram according to embodiments of the invention.

Turning now to FIG. 2, a flow diagram for creating a BIST organizational file 60, with reference to FIG. 1 and FIGS. 3-11, according to embodiments of the invention is shown. At 51, a design file 40 is received that includes a hierarchy of memory modules. For example, as shown the exemplary design file 40 in FIG. 3, a top level memory module 102 ("Module 1") includes memory modules 106, 108, 110. The design file 40 may include any type of abstraction or specification, as known in the art, including, but not limited to register-transfer-level abstraction.

Figure 3:
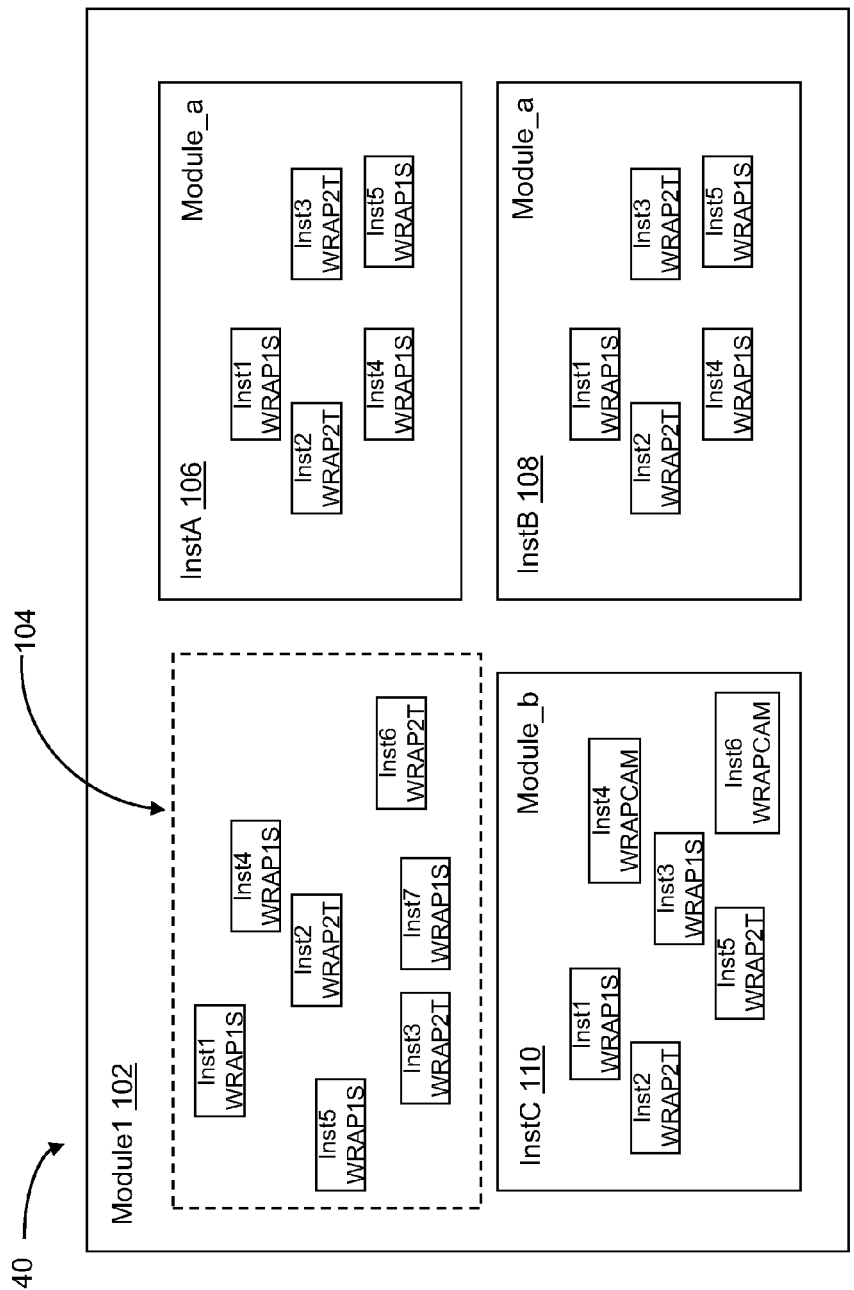
FIG. 3 shows a design file according to embodiments of the invention.
Figure 4:
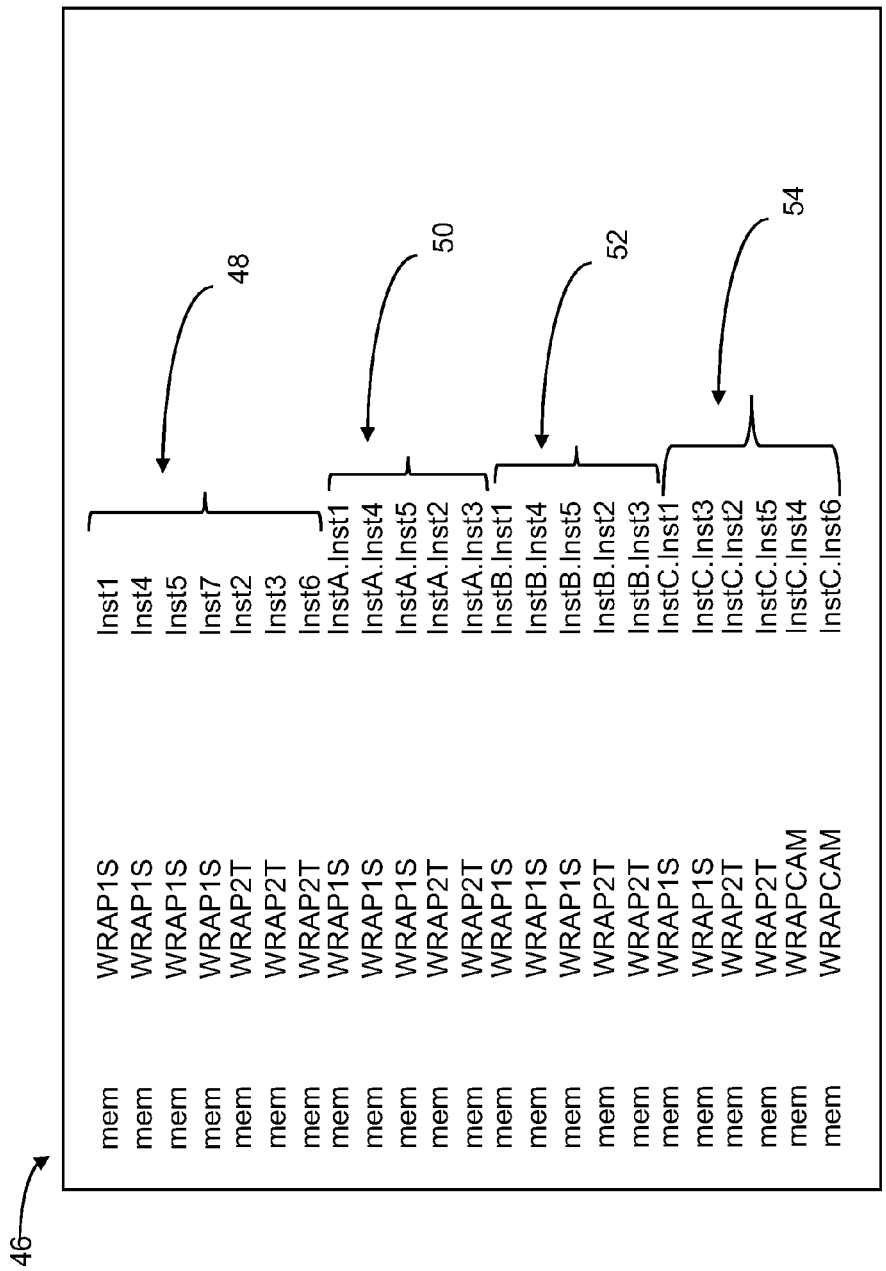
FIG. 4 shows an ordered list of memory wrappers according to embodiments of the invention.

As seen in FIG. 3, InstA memory module 106 ("Module_a") and InstaB memory module 108 ("Module_a") are identical modules. That is, they contain the same plurality of memory wrappers. Hence, both are "Module_a." InstC memory module 110 ("Module_b") is a different memory module and includes different memory wrappers.

As shown in FIG. 3, some examples of memory wrappers include, but are not limited to, "WRAP1S," "WRAP2T," and "WRAPCAM." However, it is understood that these types of memory wrappers are for exemplary purposes only, and that any now known or later developed memory wrappers may be applicable to this disclosure. Additional top-level memory wrappers 104 are also shown.

At S2, each memory wrapper in each hierarchical level of memory modules 102, 106, 108, 110 are scanned to determine a BIST type for each memory wrapper. In order to determine a BIST type for each memory wrappers, at S4, a BIST tech file 44 (FIG. 1) is received and scanned.

The hierarchical level of the memory wrapper (i.e., which memory module the memory wrapper belongs to) and the BIST type is used to create an ordered list of memory wrappers. For example, turning now to FIG. 4, an ordered list 46 of memory wrappers for the design file 40 of FIG. 3 is shown.

The top level memory wrappers 104 ("Inst1," "Inst2," "Inst3," "Inst4," "Inst5," "Inst6," and "Inst7") are shown in a first group 48. Next, the memory wrappers for InstA memory module 106 are shown in a second group 50. The memory wrappers for InstB memory module 108 are shown in a third group 52 and the memory wrappers for InstC memory module 110 are shown in a fourth group 54.

Figure 5:
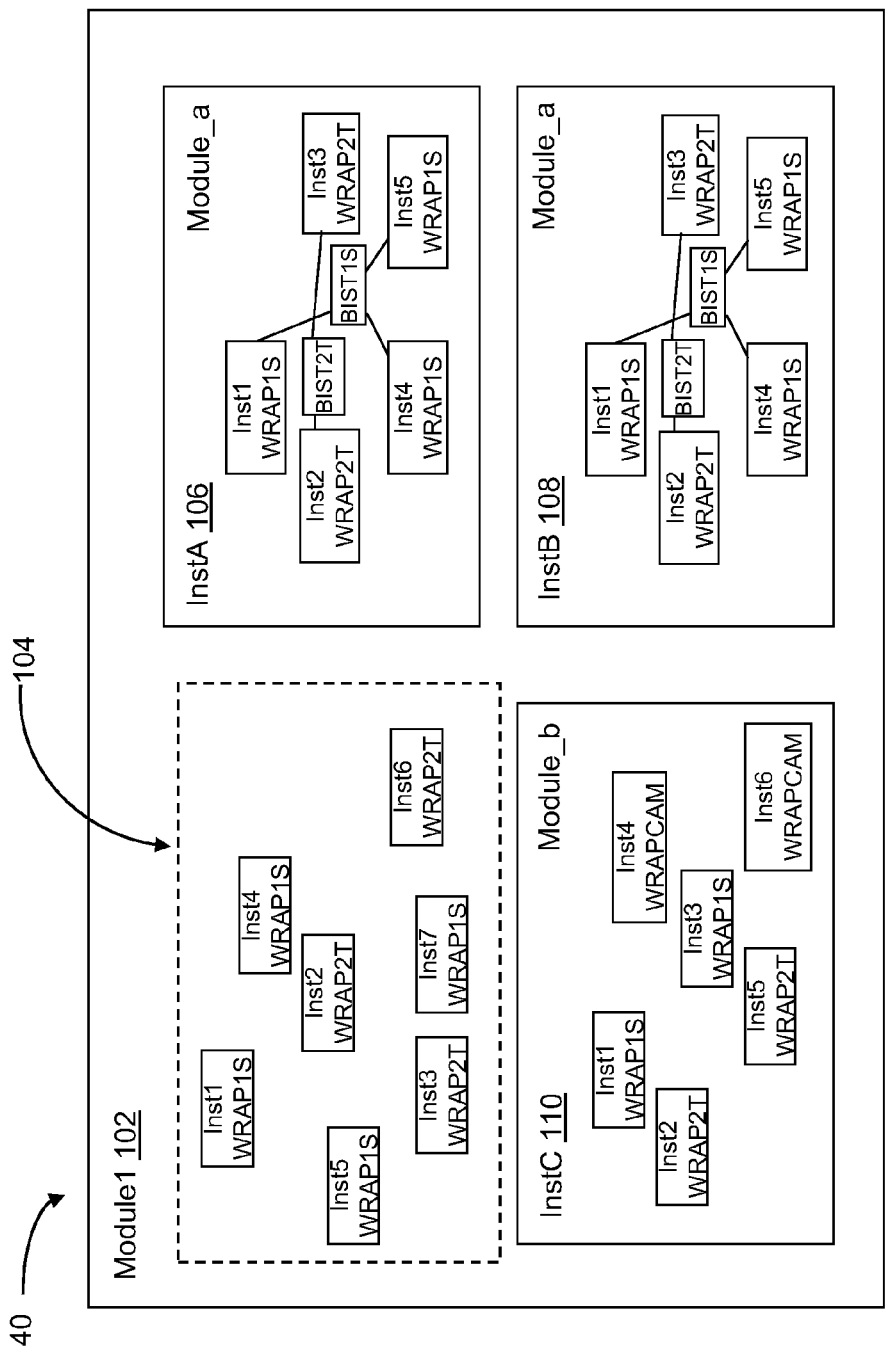
FIG. 5 shows a design file according to embodiments of the invention.
Figure 6:
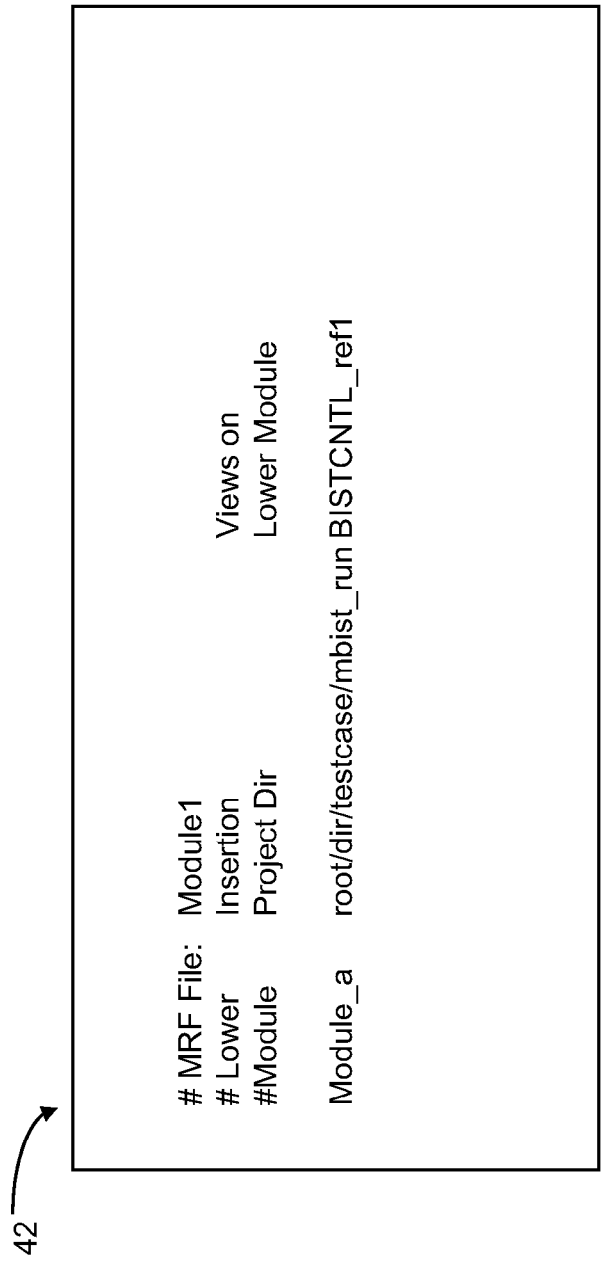
FIG. 6 shows a module reference file according to embodiments of the invention.

Turning now to FIG. 5, a design file 40 according to an alternative embodiment of the invention is shown. InstA memory module 106 and InstB memory module 108 in design file 40 in FIG. 5 already include BIST engines ("BIST1S" and "BIST2T") for the plurality of memory wrappers within these memory modules. Therefore, in this embodiment, a module reference file (MRF) 42 is received, at S5. An example of a MRF 42 is shown in FIG. 6. As shown in FIG. 6, MRF 42 lists "Module_a" as already including BIST engines. In this embodiment, at S2, only the memory modules not listed in the MRF 42 are scanned for a BIST type. Therefore, InstA memory module 106 and InstB memory module 108, since they are "Module_a" type, are not scanned at S2. Only the top level memory modules 104 and InstC memory module 110 are scanned.

Figure 7:
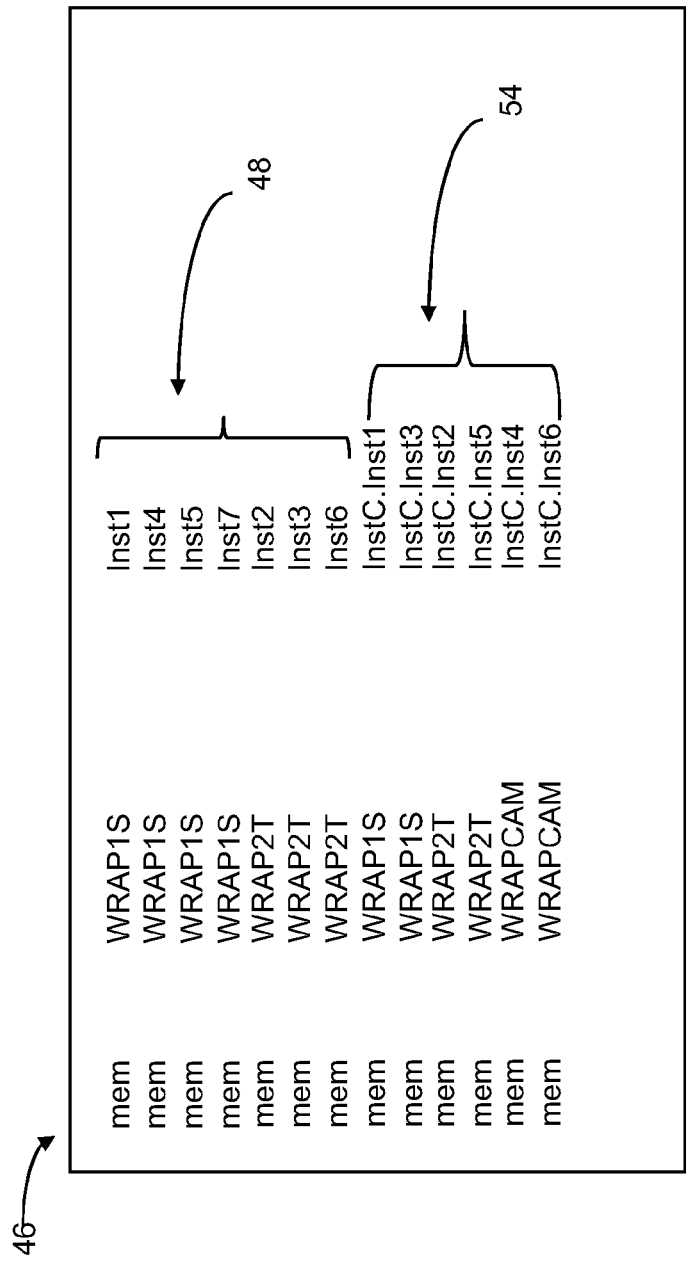
FIG. 7 shows an ordered list of memory wrappers according to embodiments of the invention.

An example of the ordered list 46 for the design file 40 shown in FIG. 5 is shown in FIG. 7. As clearly seen in FIG. 7, only a first group 48 for the top level memory modules 104 and a fourth group 54 for InstC memory module 110 is shown.

Following the example of design file 40 shown in FIG. 5 and the ordered list 46 shown in FIG. 7, at S6, a BIST engine, based on the BIST type from the BTF 44 (FIG. 1), is added for each memory wrapper listed in the ordered list 46. Additionally, MRF 42 (FIG. 6) is used to specify a "ref" reference statement to be added, for each view of each occurrence of Module_a found in design file 40. Next, at D1, a level for creating the BIST organizational file 60 (FIG. 1) is determined The level is directed by the user, as an additional User Input 31, as shown in FIG. 1, when running BIST program file 30. If the user does not specify the design file 40 as a "top level", then the level is assumed to be a level lower than the "top level". At S7 or S8, a plurality of additional statements are added to the ordered list 46 in order to create the BIST organizational file 60, as shown, for example, in FIGS. 8A and 8B or FIG. 11.

For example, at S7, additional statements for a particular module view are added to the ordered list 46 to create a BIST organizational file 60 (FIGS. 8A and 8B). For the ordered list 46 shown in FIG. 7 (for design file 40 shown in FIG. 5 that includes MRF 42 shown in FIG. 6), FIGS. 8A and 8B show the BIST organizational file 60 that is created by adding additional statements. These additional statements include "hier_ref=Module1"; "view=BISTCNTL_ref1"; and "end_view."

Figure 9:
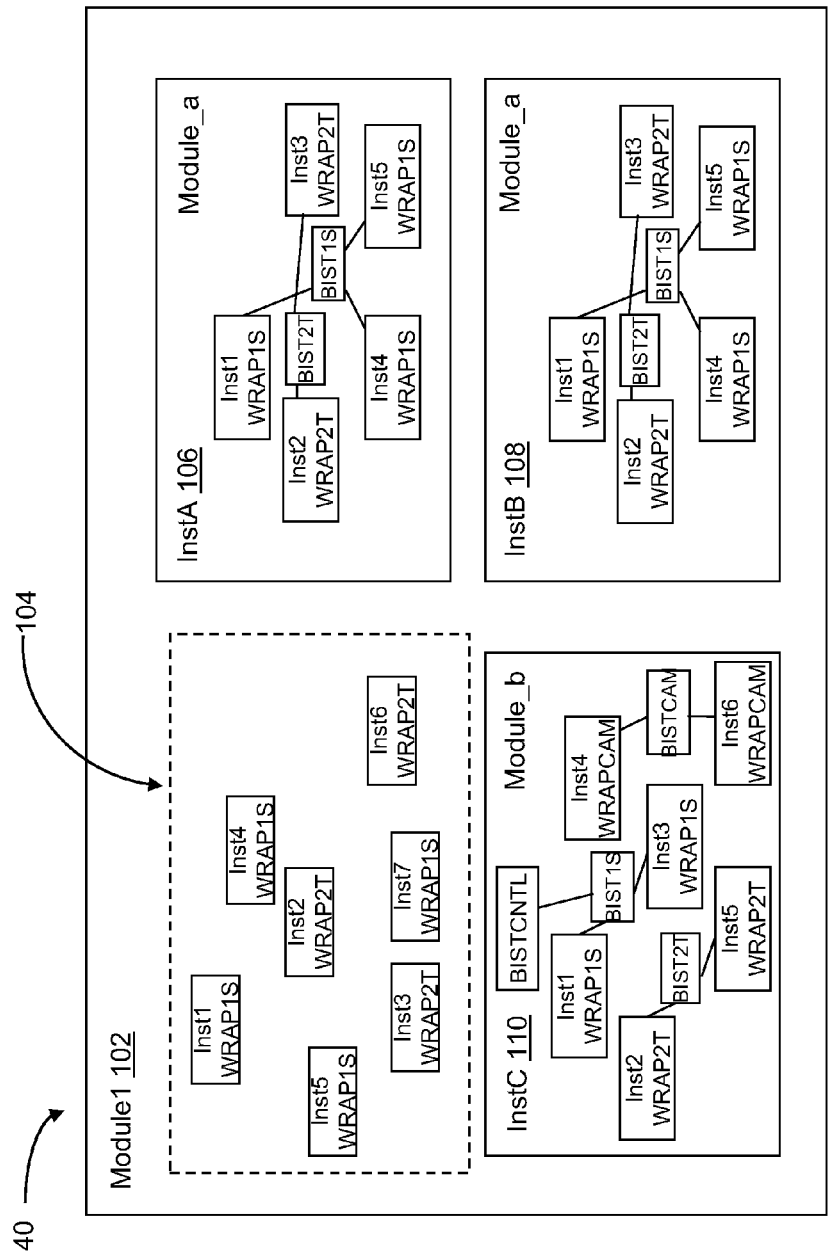
FIG. 9 shows a design file according to embodiments of the invention.
Figure 11:
FIG. 11 shows a BIST organizational file according to embodiments of the invention.

At S8, additional statements for a "top level" design are added to the ordered list 46 to create a BIST organizational file 60 (FIG. 11). The design file 40 shown in FIG. 9 is exemplary of a design file 40 where only the top level memory wrappers 104 need BIST engines. All other memory modules 106, 108, 110 already include the necessary BIST engines for the plurality of memory wrappers.

In FIG. 10, MRF 43 is used to specify, for design file 40 of FIG. 9, that both Module_a and Module_b have already have had BIST engines inserted, and all instances of both Module_a and Module_b must be excluded, when searching design file 40 for instances of memory wrappers. Furthermore, as shown in MRF 43, it is also specified that Module_a has one occurrence of a "BISTCNTL_ref1" view and Module_b has two occurrences of views associated with it, specifically a "WRAP_FUSECNTL_ref1" view and a "BISTCNTL_ref1" view.

The additional statements for a top level BIST organizational file 60, added, at S8, include, for example: "top_ref=Top"; "WRAP_CC_ECID_T09"; "WRAP FUSECENTL_T09"; "WRAP_BISTCNTL_T09"; and "end_top_ref."

It is understood that the BIST organization file 60 shown in the figures may be a text file, or any other file as known in the art. Therefore, once a customer receives the default BIST organizational file 60 as shown in FIGS. 6 and 11, the customer may modify the BIST organizational 60.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

What is claimed is:

1. A computer-implemented method of creating a built-in-self-test (BIST) organizational file for an integrated circuit (IC) chip, the method comprising:
    receiving a design file including a hierarchy of memory modules, each module including a plurality of memory wrappers;
    scanning each memory wrapper in each hierarchical level of memory modules for a BIST type;
    creating, based on the hierarchical level and the BIST type, an ordered list of memory wrappers;
    adding, based on the BIST type, a BIST engine for each memory wrapper listed in the ordered list; and
    adding a plurality of additional statements to the ordered list to create the BIST organizational file.

2. The computer-implemented method of claim 1, further comprising:
    receiving a module reference file (MRF) including a BIST organizational file for a plurality of memory wrappers in at least one module.

3. The computer-implemented method of claim 2, wherein only the plurality of memory wrappers in the modules not listed in the MRF are scanned and at least one reference statement corresponding to a specified view of each occurrence of the modules listed in the MRF is added to the BIST organizational file.

4. The computer-implemented method of claim 1, wherein scanning further comprising:
    receiving a BIST tech file (BTF) that indicates a BIST type for each type of memory wrapper; and scanning the BIST tech file for each memory wrapper in each hierarchical level of memory modules for a BIST type.

5. The computer-implemented method of claim 1, further comprising:
determining, based on the design file, a level for the BIST organizational file, wherein the plurality of references statements added to the ordered list to create the BIST organizational file is based on the level for the BIST organizational file.

6. The computer-implemented method of claim 1, wherein the design file is a register-transfer level file.

7. The computer-implemented method of claim 1, wherein the BIST organizational file is a text file.

8. A computer program comprising program code embodied in at least one non-transitory computer-readable medium, which when executed, enables a computer system to implement a method of creating a built-in-self-test (BIST) organizational file for an integrated circuit (IC) chip, the method comprising:
receiving a design file including a hierarchy of memory modules, each module including a plurality of memory wrappers;
scanning each memory wrapper in each hierarchical level of memory modules for a BIST type;
creating, based on the hierarchical level and the BIST type, an ordered list of memory wrappers;
adding, based on the BIST type, a BIST engine for each memory wrapper listed in the ordered list; and
adding a plurality of additional statements to the ordered list to create the BIST organizational file.

9. The computer program of claim 8, further comprising:
receiving a module reference file (MRF) including a BIST organizational file for a plurality of memory wrappers in at least one module.

10. The computer program of claim 9, wherein only the plurality of memory wrappers in the modules not listed in the MRF are scanned and at least one reference statement corresponding to a specified view of each occurrence is of the modules listed in the MRF added to the BIST organizational file.

11. The computer program of claim 8, wherein scanning further comprising:
receiving a BIST tech file (BTF) that indicates a BIST type for each type of memory wrapper; and
scanning the BIST tech file for each memory wrapper in each hierarchical level of memory modules for a BIST type.

12. The computer program of claim 8, further comprising:
determining, based on the design file, a level for the BIST organizational file, wherein the plurality of references statements added to the ordered list to create the BIST organizational file is based on the level for the BIST organizational file.

13. The computer program of claim 8, wherein the design file is a register-transfer level file.

14. The computer program of claim 8, wherein the BIST organizational file is a text file.

15. A computer system, comprising:
at least one computing device configured to create a built-in-self-test (BIST) organizational file for an integrated circuit (IC) chip by:
receiving a design file including a hierarchy of memory modules, each module including a plurality of memory wrappers;
scanning each memory wrapper in each hierarchical level of memory modules for a BIST type;
creating, based on the hierarchical level and the BIST type, an ordered list of memory wrappers;
adding, based on the BIST type, a BIST engine for each memory wrapper listed in the ordered list; and
adding a plurality of additional statements to the ordered list to create the BIST organizational file.

16. The computer system of claim 15, further comprising:
receiving a module reference file (MRF) including a BIST organizational file for a plurality of memory wrappers in at least one module, wherein only the plurality of memory wrappers in the modules not listed in the MRF are scanned and at least one reference statement corresponding to a specified view of each occurrence of the modules listed in the MRF is added to the BIST organizational file.

17. The computer system of claim 15, wherein scanning further comprising:
receiving a BIST tech file (BTF) that indicates a BIST type for each type of memory wrapper; and
scanning the BIST tech file for each memory wrapper in each hierarchical level of memory modules for a BIST type.

18. The computer system of claim 15, further comprising:
determining, based on the design file, a level for the BIST organizational file, wherein the plurality of references statements added to the ordered list to create the BIST organizational file is based on the level for the BIST organizational file.

19. The computer system of claim 15, wherein the design file is a register-transfer level file.

20. The computer system of claim 15, wherein the BIST organizational file is a text file.

* * * * *